(12) United States Patent
Kim et al.

(10) Patent No.: US 12,594,606 B2
(45) Date of Patent: Apr. 7, 2026

(54) COATED CUTTING TOOL AND METHOD FOR MAKING COATING LAYER

(71) Applicant: YG-1 Co., Ltd, Incheon (KR)

(72) Inventors: Dong Seob Kim, Chungju-si (KR); Hye Min Ahn, Chungju-si (KR); Geun Woo Park, Chungju-si (KR)

(73) Assignee: YG-1 Co., Ltd, Incheon (KR)

( * ) Notice: Subject to any disclaimer, the term of this patent is extended or adjusted under 35 U.S.C. 154(b) by 560 days.

(21) Appl. No.: 17/968,749

(22) Filed: Oct. 18, 2022

(65) Prior Publication Data

US 2023/0286056 A1 Sep. 14, 2023

(30) Foreign Application Priority Data

Mar. 8, 2022 (KR) ........................ 10-2022-0029266

(51) Int. Cl.
| | |
|---|---|
| *B23B 27/14* | (2006.01) |
| *C23C 16/02* | (2006.01) |
| *C23C 16/34* | (2006.01) |
| *C23C 16/36* | (2006.01) |
| *C23C 16/40* | (2006.01) |
| *C23C 16/56* | (2006.01) |

(52) U.S. Cl.
CPC ........ *B23B 27/148* (2013.01); *C23C 16/0272* (2013.01); *C23C 16/34* (2013.01); *C23C 16/36* (2013.01); *C23C 16/403* (2013.01); *C23C 16/56* (2013.01); *B23B 2228/105* (2013.01)

(58) Field of Classification Search
None
See application file for complete search history.

(56) References Cited

U.S. PATENT DOCUMENTS

| | | | |
|---|---|---|---|
| 7,993,742 B2 | 8/2011 | Ruppi | |
| 9,945,029 B2 | 4/2018 | Bjormander | |
| 9,987,687 B2 * | 6/2018 | Lindahl | ............... C23C 16/0272 |
| 11,185,929 B2 | 11/2021 | Akesson | |
| 11,203,069 B2 | 12/2021 | Morjan Brenning | |

(Continued)

FOREIGN PATENT DOCUMENTS

| | | |
|---|---|---|
| JP | 3658949 | 6/2005 |
| KR | 101314504 B1 | 10/2013 |

*Primary Examiner* — Seth Dumbris
(74) *Attorney, Agent, or Firm* — STIP Law Group, LLC

(57) ABSTRACT

Disclosed are a coated cutting tool in which a coating layer is formed and a method for making the coating layer. The coating layer of the cutting tool of the present disclosure is formed on the whole or part of a substrate, and includes an MT-TiCN layer and an $\alpha$-$Al_2O_3$ layer which are formed of columnar grains. The MT-TiCN layer has texture coefficients of TC(311)>1.5 and TC(422)>1.5 and is formed of TiCN deposited by a chemical vapor deposition method within the range of 800° C. to 950° C., and the $\alpha$-$Al_2O_3$ layer is formed of columnar grains and has TC(006)>4. The coating layer of the present disclosure may form a coating layer (coating) having excellent wear resistance and chipping resistance by depositing, an $\alpha$-$Al_2O_3$ layer having a strong orientation in a <001> crystallographic direction with excellent adhesion, without using an HT-TiCN layer as in the related art.

16 Claims, 5 Drawing Sheets

110 {
α-Al₂O₃ layer — 109
TiCNO bonding layer — 107
MT-TiCN layer — 105
TiN layer — 103
}
substrate — 101

100

(56)      References Cited

U.S. PATENT DOCUMENTS

| | | | |
|---|---|---|---|
| 2011/0247465 A1* | 10/2011 | Lind ..................... | C23C 30/005 |
| | | | 407/119 |
| 2012/0015148 A1* | 1/2012 | Ruppi .................... | C23C 16/36 |
| | | | 423/625 |
| 2016/0332237 A1* | 11/2016 | Nakamura ............ | B23B 27/148 |
| 2018/0258525 A1* | 9/2018 | Cho ...................... | C23C 28/044 |
| 2022/0288697 A1 | 9/2022 | Alm | |

* cited by examiner

100

300

COATED CUTTING TOOL AND METHOD FOR MAKING COATING LAYER

CROSS-REFERENCE TO RELATED APPLICATION

This application claims priority to Korean Patent Application No. 10-2022-0029266 filed on Mar. 8, 2022, and all the benefits accruing therefrom under 35 U.S.C. § 119, the contents of which are incorporated by reference in their entirety.

BACKGROUND

The present disclosure herein relates to a coated cutting tool in which a coating layer including an $\alpha$-$Al_2O_3$ layer is formed, and a method for making the coating layer.

A coating requires an excellent adhesion to a base material in conjunction with the mechanical excellence of a coating material. In order to secure excellent adhesion, a method of depositing a plurality of coating layers by overlapping them has been conventionally used. $\alpha$-$Al_2O_3$, which is one of the coating materials, is a material having good chemical stability and thermal properties, and an $\alpha$-$Al_2O_3$ texture control technology may be used to improve mechanical properties of the $\alpha$-$Al_2O_3$ thin film by controlling a crystallographic direction for growing the $\alpha$-$Al_2O_3$ texture. Conventionally, the $\alpha$-$Al_2O_3$ thin film technology has been well-known in which the texture is controlled in the plane directions of (006), (012), (104), (110), (113), (116), and the like. Among them, the (006) crystallographic orientation has texture characteristics that are mechanically superior to other orientations, and Korean Patent No. 10-1314504 discloses an example of a technique for the orientation.

A method for making an $\alpha$-$Al_2O_3$ thin film on the surface of a substrate is conventionally known, which is formed by sequentially stacking a TiN layer on a base material, an MT-TiCN layer, an HT-TiCN bonding layer, and a TiCNO bonding layer, and then depositing an $\alpha$-$Al_2O_3$ layer on the TiCNO bonding layer. The HT-TiCN layer, which is a bonding layer provided between the $\alpha$-$Al_2O_3$ layer and the MT-TiCN layer, is a dense equiaxed crystal structure and is deposited at a high temperature of 1,000° C. or higher using mainly $N_2$ and $CH_4$ gases as a source. Although the HT-TiCN bonding layer provides excellent adhesion between the MT-TiCN layer and the $\alpha$-$Al_2O_3$ layer, there is a limitation in that the HT-TiCN bonding layer has a side effect of inducing the texture of the $\alpha$-$Al_2O_3$ layer to the (104) plane orientation, and thus interferes with the (006) plane orientation of the $\alpha$-$Al_2O_3$ layer. Therefore, in order to suppress the side effect of interfering the orientation of the plane with the (006) plane orientation, the thickness of the TiCNO bonding layer is increased in the related art, and when the TiCNO bonding layer becomes thick, the adhesiveness of the HT-TiCN bonding layer to the $\alpha$-$Al_2O_3$ layer deteriorates, resulting in poor performance and life of the tool.

PRIOR ART DOCUMENT

Patent Documents (Patent Document 0001) Korean Patent No. KR 10-1314504 (Title of the Invention: CUTTING TOOL INSERT COMPRISING $\alpha$-ALUMINA LAYER AND METHOD OF MAKING $\alpha$-ALUMINA LAYER)

SUMMARY

The present disclosure provides a coated cutting tool in which a coating layer including an $\alpha$-$Al_2O_3$ layer in a strong (006) plane orientation is formed, and a method for making the coating layer which can deposit an $\alpha$-$Al_2O_3$ layer with excellent adhesion.

In accordance with an exemplary embodiment of the present invention, a cutting tool includes a substrate, a coating layer formed on the upper portion of the substrate, wherein the coating layer includes: an MT-TiCN layer formed by an MTCVD technique; a TiCNO layer, which is a bonding layer directly deposited on the surface of the MT-TiCN layer; and an $\alpha$-$Al_2O_3$ layer, which are sequentially formed from the substrate side. Therefore, there does not exist an HT-TiCN layer between the MT-TiCN layer and the $\alpha$-$Al_2O_3$ layer.

The MT-TiCN layer has a columnar structure and has texture coefficients of TC(311)>1.5 and TC(422)>1.5, and the $\alpha$-$Al_2O_3$ layer has a texture coefficient of TC(006)>4 and is formed of columnar grains. Here, the TC (311), TC (422), and TC (006) are defined according to the Equation below which is Harris formula.

$$TC(hkl) = \frac{I(hkl)}{I_0(hkl)}\left[\frac{1}{n}\sum_{n=1}^{n}\frac{I(hkl)}{I_0(hkl)}\right]^{-1}$$

I(hkl) above is the reflection or diffraction intensity of the measured (hkl) plane, and $I_0$(hkl) above is the standard intensity according to the PDF of ICDD. The standard intensity according to the PDF Card No. 42-1489 of ICDD is used to calculate the texture coefficient of the MT-TiCN layer, and the standard intensity according to the PDF Card No. 42-1212 of ICDD is used to calculate the texture coefficient of the $\alpha$-$Al_2O_3$ layer.

n is the number of reflecting planes used in the calculation of the texture coefficients, the (hkl) reflecting planes used in the calculation of the texture coefficient of the MT-TiCN layer are (111), (200), (220), (311), and (422) and the (hkl) reflecting planes used in the calculation of the texture coefficient of the $\alpha$-$Al_2O_3$ layer are (012), (104), (110), (006), (113), and (116).

According to an embodiment, the MT-TiCN layer includes an upper layer and a lower layer thereof, and thus the TiCNO layer is directly deposited on the surface of the upper layer. The deposition temperature of the upper layer is 1.11-1.15 times higher than that of the lower layer. The lower layer is deposited by a chemical vapor deposition (CVD) method using $H_2$, $TiCl_4$, and $CH_3CN$ as a source at 850° C. at an initial stage, and using $H_2$, $N_2$, $TiCl_4$, and $CH_3CN$ as a source at 850° C. at a middle stage, and the upper layer is deposited by the CVD method using $H_2$, $N_2$, $TiCl_4$, $CH_3CN$, and HCl as a source at 950° C.

According to an embodiment, the thickness of the TiCNO bonding layer is preferably 0.2 μm to 1.3 μm, the thickness of the $\alpha$-$Al_2O_3$ layer is preferably 1.5 μm to 10 μm, and the thickness of the MT-TiCN layer is preferably 2 μm to 12 μm.

According to another embodiment, the coating layer of the present disclosure may further include a TiN layer formed on the upper surface of the $\alpha$-$Al_2O_3$ layer by using a mixed gas of $H_2$, $N_2$, and $TiCl_4$ as a source.

Meanwhile, the surface of the coating layer may be subjected to a brushing process using a paste containing diamond powder.

Method for Making a Coating Layer

The present disclosure pertains to a method for making a coating layer on the whole or part of a substrate of a cutting tool. The method for making a coating layer according to the present disclosure includes: depositing a TiN layer on the upper surface of the substrate; depositing an MT-TiCN layer which has texture coefficients of TC(311)>1.5 and TC(422)>1.5 and is formed of columnar grains of TiCN deposited on the TiN layer by a chemical vapor deposition method within the range of 800° C. to 950° C.; depositing a TiCNO bonding layer on the upper surface of the MT-TiCN layer, and then oxidizing the TiCNO bonding layer for a predetermined time using $H_2$, $N_2$, CO, and $CO_2$; and depositing, on the oxidized TiCNO bonding layer, an $\alpha$-$Al_2O_3$ layer which has a texture coefficient of TC(006)>4 and is formed of columnar grains.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, embodiments of the present invention will be described in more detail with reference to the accompanying drawings.

Figure 1:
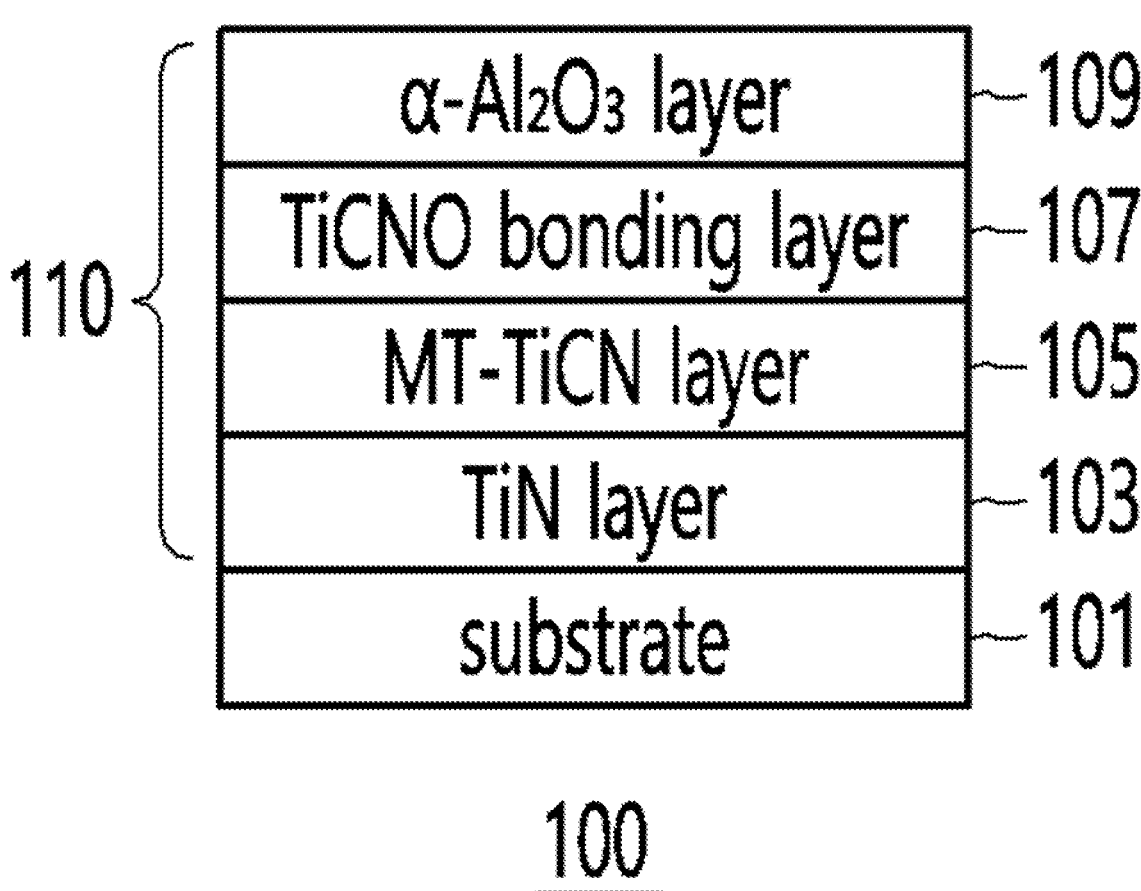
FIG. 1 is a diagram illustrating a configuration of a cross-section of a coating layer according to an embodiment of the present disclosure.

Referring to FIG. 1, a cutting tool 100 according to the present disclosure includes a substrate 101 and a coating layer 110 formed on the whole or part of the surface of the substrate 101, and may be applied to various types of cutting tools.

The substrate 101 may be formed of a material such as a superhard material, such as ceramic or cubic boron nitride (CBN), or a cemented carbide, and a cemented carbide, which is generally widely used, is preferable. The cemented carbide includes 4-15 wt % of Co (preferably 6-10 wt % of Co) and 5-12 vol % of cubic carbides of metals from groups IV, V and VI of the periodic table (preferably Ti, Nb, and Ta).

The coating layer 110 is formed on the substrate 101, and a TiN layer 103, an MT-TiCN layer 105, a TiCNO bonding layer 107, and an $\alpha$-$Al_2O_3$ layer 109 are deposited in this order using a chemical vapor deposition (CVD) method.

The TiN layer 103 is provided on the upper portion of the substrate 101 using a mixed gas of $H_2$, $N_2$, and $TiCl_4$ as source.

The MT-TiCN layer 105 is formed by being coated on the upper surface of the TiN layer 103 with a gas selectively mixed with $H_2$, $N_2$, $TiCl_4$, $CH_3CN$ and HCl as source using a medium temperature chemical vapor deposition (MTCVD) technique.

Figure 4:
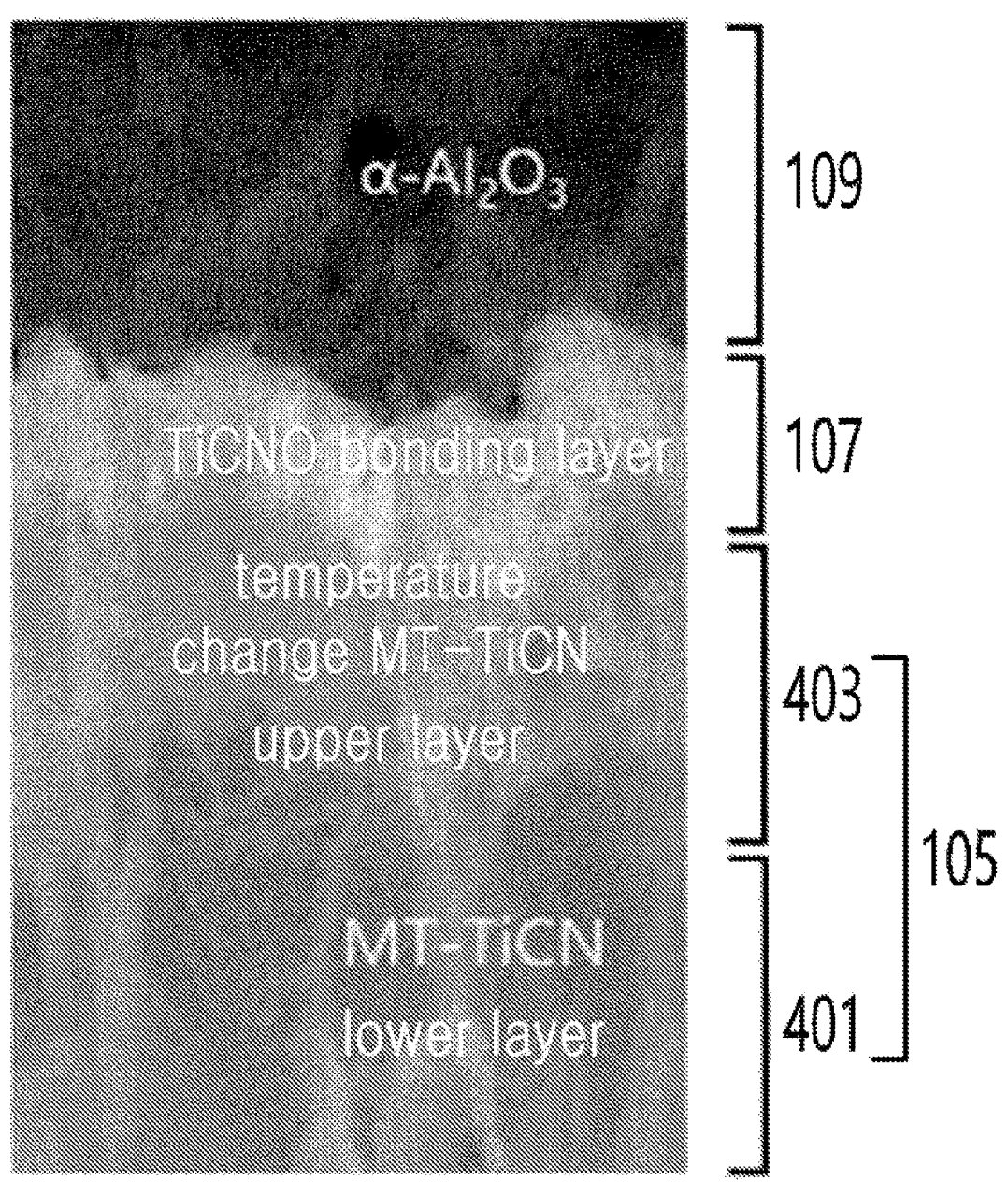
FIG. 4 is a transmission electron microscope image of a cross-section of an evaluation sample according to the present disclosure.

Here, the MTCVD is a chemical vapor deposition method within a temperature range of 800° C. to 950° C., and the TiCN coating film coated with the MTCVD technique is referred to as the MT-TiCN layer 105. The thickness of the MT-TiCN layer 105 is 2 μm to 12 μm, preferably 3 μm to 9 μm. When the MT-TiCN layer 105 is thinner than 2 μm, the crystallographic characteristics of the columnar are not sufficiently met, and thus the chipping resistance or resistance against flank wear of the tool may be deteriorated, and when the thickness of the layer 105 exceeds 12 μm, the coating may be flaked off and the chipping resistance thereof may be weakened, and thus the tool life may be reduced. The MT-TiCN layer 105 includes a lower layer 401 and an upper layer 403 deposited under different temperature conditions as shown in FIG. 4. The crystallographic characteristics of the MT-TiCN layer 105 of the present disclosure will be described again below.

The TiCNO bonding layer 107 is formed on the upper surface of the MT-TiCN layer 105 using a mixed gas of $H_2$, $N_2$, $TiCl_4$, $CH_3CN$, and CO as source. The TiCNO bonding layer 107 is a bonding layer that bonds the MT-TiCN layer 105 and the $\alpha$-$Al_2O_3$ layer 109, and bonds the MT-TiCN layer 105 and the $\alpha$-$Al_2O_3$ layer 109 without using the HT-TiCN layer unlike the related art. The TiCNO bonding layer 107 is formed to be a thickness of 0.2 μm to 1.3 μm. When the TiCNO bonding layer 107 is thinner than 0.2 μm, it is difficult to obtain a high (006) T.C value of $\alpha$-$Al_2O_3$, and when the TiCNO bonding layer 107 exceeds 1.3 μm, the adhesiveness with the underlying layer is inhibited to cause flaking between the MT-TiCN 105 and the $\alpha$-$Al_2O_3$ layer 109, and thus the tool life may be reduced.

The $\alpha$-$Al_2O_3$ layer 109 is formed on the upper surface of the TiCNO bonding layer 107 using a gas selectively mixed with $H_2$, HCl, $AlCl_3$, $CO_2$ and $H_2S$ as source. The $\alpha$-$Al_2O_3$ layer 109 is deposited to be a thickness of 1.5 μm to 10 μm. When the $\alpha$-$Al_2O_3$ layer 109 is thinner than 1.5 μm, it is difficult to prevent plastic deformation due to high temperatures generated during cutting, and it is difficult to have sufficient wear-resistance, thereby reducing the tool life, and when the $\alpha$-$Al_2O_3$ layer 109 exceeds 10 μm, the flaking resistance and chipping resistance of the coating are weakened, thereby causing an unexpected end-of-life. In the present disclosure, the MT-TiCN layer 105 and the $\alpha$-$Al_2O_3$ layer 109 are formed of columnar grains.

Crystallographic Characteristics of MT-TiCN Layer 105 and $\alpha$-$Al_2O_3$ Layer 109

Hereinafter, the crystallographic characteristics of the MT-TiCN layer 105 and the $\alpha$-$Al_2O_3$ layer 109 of the present disclosure are defined by using a texture coefficient (TC) obtained according to the Harris formula using an X-ray diffraction analysis (XRD) diffraction pattern. When defined as the texture coefficient obtained according to the Harris formula, the MT-TiCN layer 105 has characteristics of TC(311)>1.5 and TC(422)>1.5, and the $\alpha$-$Al_2O_3$ layer 109 has characteristics of TC(006)>4. The Harris formula is as shown in Equation 1 below:

$$TC(hkl) = \frac{I(hkl)}{I_0(hkl)}\left[\frac{1}{n}\sum_{n=1}^{n}\frac{I(hkl)}{I_0(hkl)}\right]^{-1} \qquad \text{[Equation 1]}$$

In Equation 1, I(hkl) is the reflection or diffraction intensity of the measured (hkl) plane, and $I_0$(hkl) is the standard intensity according to the powder diffraction file (PDF) of International Centre for Diffraction Data (ICDD). The standard intensity according to the PDF Card No. 42-1489 of ICDD is used for the calculation of the texture coefficient of the MT-TiCN layer 105, and the standard intensity according to the PDF Card No. 42-1212 of ICDD is used for the calculation of the texture coefficient of the $\alpha$-$Al_2O_3$ layer 109. The PDF of ICDD is data on the basis of a standard powder, and is an organic and inorganic diffraction database for phase identification and material characterization by powder diffraction.

In Equation 1, n is a natural number n>0, which is the number of reflecting planes used to calculate the texture coefficient.

The (hkl) reflecting planes used to calculate the texture coefficient of the MT-TiCN layer 105 are (111), (200), (220), (311) and (422), and under this condition, the MT-TiCN layer 105 of the present disclosure should satisfy TC(311) >1.5 and TC(422)>1.5. By satisfying this, the orientation of the MT-TiCN layer 105 may strongly facilitate the (006) plane orientation of the $\alpha$-$Al_2O_3$ layer 109. As described above, the thickness of the MT-TiCN layer 105 is 2 $\mu$m to 12 $\mu$m, preferably 3 $\mu$m to 9 $\mu$m.

The (hkl) reflecting planes used to calculate the texture coefficients of the $\alpha$-$Al_2O_3$ layer 109 are (012), (104), (110), (006), (113) and (116), and the $\alpha$-$Al_2O_3$ layer 109 of the present disclosure should satisfy TC(006)>4. The fact that TC (006) is greater than 4 means that the crystallographic orientation of the $\alpha$-$Al_2O_3$ layer 109 has been made strongly in the <001> direction because if the texture coefficient TC(hkl) according to the Harris formula is greater than 1, it means that the orientation of the crystalline material is present parallel to the surface of the substrate at least more frequently than the random orientation of the standard powder. The strong (006) plane orientation of the $\alpha$-$Al_2O_3$ layer 109 means that the orientation of the crystal in the <001> crystallographic direction has been achieved, and the (006) plane orientation has grown to a (006) crystallographic plane that is more frequently parallel to the surface of the substrate than other crystallographic planes of the $\alpha$-$Al_2O_3$ layer that are parallel to the surface of the substrate.

The coating layer (110) of the present disclosure, which is formed as the composite layers as described above, has strong resistance against crater wear and flank wear, and has an excellent bonding force between the MT-TiCN layer 105 and the $\alpha$-$Al_2O_3$ layer 109 so that the chipping resistance is improved. Above all, since the coating layer 110 of the present disclosure does not use the HT-TiCN layer, the limitation, in which the (006) plane orientation of the $\alpha$-$Al_2O_3$ layer 109 is disturbed by using the HT-TiCN layer as described in the background art, is eliminated.

Method for Producing Coating (Coating Layer)

Figure 2:
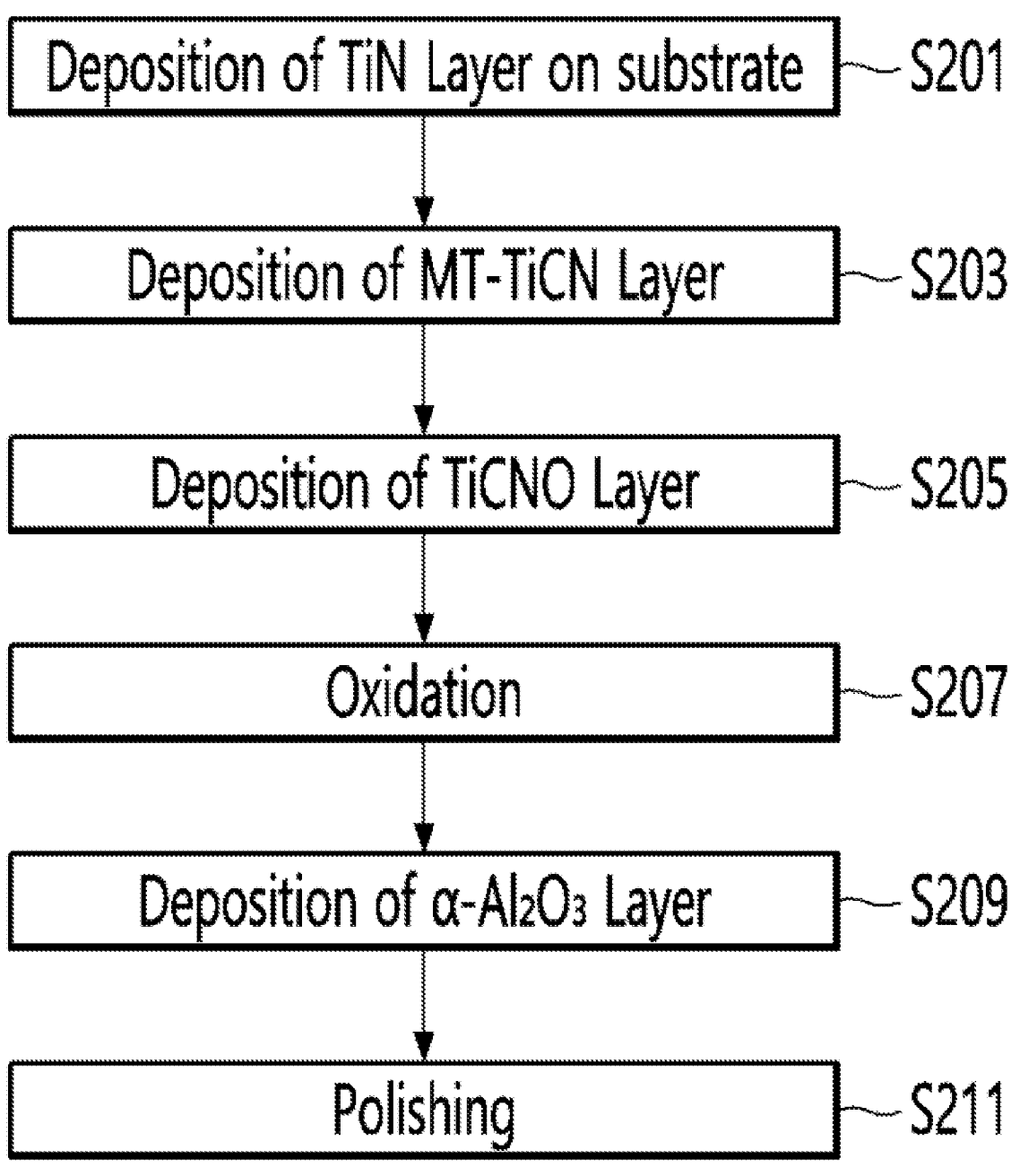
FIG. 2 is a flowchart provided in the description of a method for making the coating layer of FIG. 1.

Hereinafter, referring to FIG. 2, a method for producing a coating (coating layer) according to the present disclosure will be described through a sample production process of Examples of the present disclosure and Comparative Examples. The coating layer 110 is produced in a CVD vacuum chamber (not shown).

<Production of TiN Layer: S201>

In the chamber, a substrate 101 is disposed as a target, a mixed gas of $H_2$, $N_2$, and $TiCl_4$ is used as source in the chamber, and a TiN layer 103 is deposited.

<Deposition of MT-TiCN Layer: S203>

The MT-TiCN layer 105 is deposited on the upper surface of the TiN layer 103 using a gas selectively mixed with $H_2$, $N_2$, $TiCl_4$, $CH_3CN$, and HCl as source by means of an MTCVD technique. For the MT-TiCN layer 105, a lower layer 401 is deposited using $H_2$, $TiCl_4$ and $CH_3CN$ as source at 850° C. at an initial stage and using $H_2$, $N_2$, $TiCl_4$ and $CH_3CN$ as source at 850° C. at a middle stage, and then at the end stage of the deposition, an upper layer 403 is deposited using $H_2$, $N_2$, $TiCl_4$, $CH_3CN$ and HCl as source at 950° C. By such adjustment of the deposition temperature, the MT-TiCN layer 105 includes the lower layer 401 deposited at 850° C. and the upper layer 403 deposited at 950° C.

as shown in FIG. 4, and the upper layer 403, which is a temperature change layer, functions as a bonding layer for improving adhesiveness between the TiCNO layer 107.

<Deposition of TiCNO Layer: S205, S207>

When the MT-TiCN layer 105 has been deposited, a thin TiCNO bonding layer 107 is deposited on the upper surface of the MT-TiCN layer 105 by using a mixed gas of $H_2$, $N_2$, $TiCl_4$, $CH_3CN$, and CO as source (S205). When the TiCNO bonding layer 107 has been deposited, oxidation is performed for approximately 2 minutes by using $H_2$, $N_2$, CO, and $CO_2$ (S207).

<Deposition of $\alpha$-$Al_2O_3$ Layer: S209>

A gas selectively mixed with $H_2$, HCl, $AlCl_3$, $CO_2$, and $H_2S$ is used as source to deposit the $\alpha$-$Al_2O_3$ layer 109 on the upper surface of the oxidized TiCNO bonding layer 107.

<Polishing: S211>

According to an example, after the $\alpha$-$Al_2O_3$ layer 109 is deposited, the surface of the $\alpha$-$Al_2O_3$ layer 109 may be polished by brushing the surface thereof using a paste including diamond powder. The production of the coating (coating layer) of the present disclosure is performed by the above method.

EXAMPLE (FIG. 3)

Figure 3:
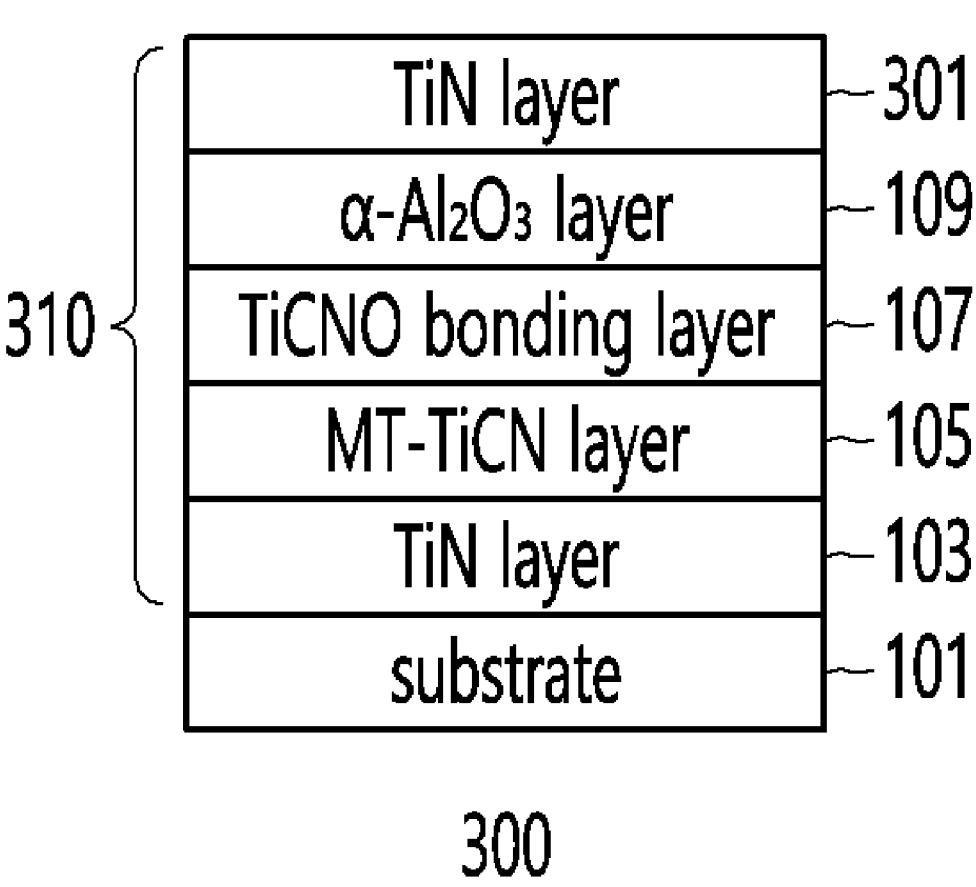
FIG. 3 is a diagram illustrating a configuration of a cross-section of a coating layer according to another example of the present disclosure.

Referring to FIG. 3, a coating layer 310 according to another example of the present disclosure may further include a TiN layer 301 deposited on the upper surface of the $\alpha$-$Al_2O_3$ layer 109 in addition to the coating layer 110 of FIG. 1. When the TiN layer 301 is additionally deposited on the upper surface of the $\alpha$-$Al_2O_3$ layer 109, the method for producing a coating (coating layer) further includes depositing the TiN layer 301 on the $\alpha$-$Al_2O_3$ layer 109 using a mixed gas of $H_2$, $N_2$, and $TiCl_4$ as source after depositing the $\alpha$-$Al_2O_3$ layer 109 in step S209. The polishing step of S211 is performed after the depositing of the TiN layer 301, on the surface of the TiN layer 301, i.e., on the uppermost surface of the coating layer.

The TiN layer 301 further improves the wear-resistance of the thin film, and at the same time, acts as a wear-recognition layer which displays the wear state of the coating layer because the TiN layer is yellow.

EXAMPLE (PERFORMANCE COMPARISON)

In order to evaluate the performance of the coating layer 110 formed by the present disclosure, an evaluation sample obtained by coating an insert according to the present disclosure, and first and second comparative samples using the HT-TiCN bonding layer were produced, respectively, and compared as follows. The HT-TiCN layer was used for each of the first and second comparative samples.

<Evaluation Sample>

On the upper portion of the substrate of a cemented carbide cutting tool with an ISO P15 grade, a TiN layer having about 0.5 $\mu$m was deposited using $H_2$, $N_2$ and $TiCl_4$, and an MT-TiCN layer having about 8 $\mu$m was deposited on the upper surface of the TiN layer using $H_2$, $N_2$, $TiCl_4$, $CH_3CN$ and HCl as source. At the initial stage of deposition of the MT-TiCN layer, $H_2$, $TiCl_4$ and $CH_3CN$ were used as source at 850° C., at the middle stage, $H_2$, $N_2$, $TiCl_4$ and $CH_3CN$ were used as source at 850° C., and at the end stage of deposition, $H_2$, $N_2$, $TiCl_4$, $CH_3CN$ and HCl were used as source, and the deposition temperature was controlled at 950° C., and thus the MT-TiCN layer was maintained, and an HTCVD method for depositing the HT-TiCN layer was not used. Table 1 shows the detailed deposition conditions of TiN and MT-TiCN of the evaluation sample.

TABLE 1

| | Temperature [° C.] | Pressure [mbar] | H$_2$ [vol %] | N$_2$ [vol %] | TiCl$_4$ [vol %] | CH$_3$CN [vol %] | HCl [vol %] |
|---|---|---|---|---|---|---|---|
| TiN | 915 | 200 | 62.6 | 36.1 | 1.3 | — | — |
| TiCN initial stage | 850 | 70 | 96.4 | — | 2.95 | 0.65 | — |
| TiCN middle stage | 850 | 55 | 78.9 | 17.8 | 2.45 | 0.85 | — |
| TiCN end stage | 950 | 55 | 82.1 | 14.4 | 2.45 | 0.62 | 0.43 |

Under the deposition conditions of 1,000° C. and 55 mbar, a TiCNO bonding layer 107 having a thickness of 0.3 μm to 1 μm was deposited on the upper surface of the MT-TiCN layer 105 using H$_2$, N$_2$, TiCl$_4$, CH$_3$CN, and CO, and oxidized for 2 minutes using H$_2$, N$_2$, CO, and CO$_2$. After oxidation, the α-Al$_2$O$_3$ layer 109 was deposited in two steps under the deposition conditions of 1,000° C. and 65 mbar. First, an initial α-Al$_2$O$_3$ was deposited to be a thickness of about 0.2 μm using H$_2$, HCl, AlCl$_3$, and CO$_2$, and an end α-Al$_2$O$_3$ layer was deposited to be a thickness of about 8 μm using H$_2$, HCl, AlCl$_3$, CO$_2$, and H$_2$S as source, thereby producing an evaluation sample of the present disclosure. Table 2 shows the detailed deposition conditions of the TiCNO layer and the α-Al$_2$O$_3$ layer of the evaluation sample.

TABLE 2

| | Temperature [° C.] | Pressure [mbar] | H$_2$ [vol %] | N$_2$ [vol %] | TiCl$_4$ [vol %] | CH$_3$CN [vol %] | HCl [vol %] | AlCl$_3$ [vol %] | CO [vol %] | CO$_2$ [vol %] | H$_2$S [vol %] |
|---|---|---|---|---|---|---|---|---|---|---|---|
| TiCNO | 1000 | 55 | 58.5 | 33.2 | 3.3 | 1.2 | — | — | 3.8 | — | — |
| Oxidation | 1000 | 55 | 70.3 | 15 | — | — | — | — | 10 | 4.7 | — |
| Al$_2$O$_3$ initial stage | 1000 | 65 | 91 | — | — | — | 1.7 | 3.4 | — | 3.6 | — |
| Al$_2$O$_3$ end stage | 1000 | 65 | 91 | — | — | — | 1.7 | 3.4 | — | 3.6 | 0.3 |

<First Comparative Sample>

On the upper portion of the same substrate as the evaluation sample, a TiN layer and an MT-TiCN layer were deposited by a conventional method, and an HT-TiCN bonding layer having about 1 μm was deposited by the HTCVD technique. A TiN layer having about 0.5 μm was deposited on the substrate using H$_2$, N$_2$, and TiCl$_4$, and an MT-TiCN layer having about 8 μm and an HT-TiCN layer having about 1 μm were sequentially deposited on the upper surface of the TiN layer. In the case of the MT-TiCN layer, H$_2$, TiCl$_4$, and CH$_3$CN were used as an initial-stage source at 850° C., and H$_2$, N$_2$, TiCl$_4$, and CH$_3$CN were used as a middle-stage source. At the end stage of the TiCN deposition, an HT-TiCN bonding layer having about 1 μm was deposited on the upper surface of the MT-TiCN layer under conditions of 1,000° C. and 160 mbar according to the HTCVD method using H$_2$, N$_2$, TiCl$_4$, and CH$_4$ as source. Table 3 shows the detailed deposition conditions of TiN, MT-TiCN and HT-TiCN of the first comparative sample.

TABLE 3

| | Temperature [° C.] | Pressure [mbar] | H$_2$ [vol %] | N$_2$ [vol %] | TiCl$_4$ [vol %] | CH$_3$CN [vol %] | HCl [vol %] | CH$_4$ [vol %] |
|---|---|---|---|---|---|---|---|---|
| TiN | 915 | 200 | 62.6 | 36.1 | 1.3 | — | — | — |
| TiCN initial stage | 850 | 70 | 96.4 | — | 2.95 | 0.65 | — | — |
| TiCN middle stage | 850 | 55 | 78.9 | 17.8 | 2.45 | 0.85 | — | — |
| TiCN end stage | 1000 | 160 | 76.6 | 16.7 | 1.6 | — | — | 5.1 |

Under the deposition conditions of 1,000° C. and 55 mbar, a TiCNO layer having a thickness of 0.3 μm to 1 μm was deposited on the upper surface of the HT-TiCN layer using $H_2$, $N_2$, $TiCl_4$, $CH_3CN$, and CO, and oxidized for 2 minutes using $H_2$, $N_2$, CO, and $CO_2$. After oxidation, in the same manner as in the evaluation sample, an $\alpha$-$Al_2O_3$ layer was deposited in two steps under deposition conditions of 1,000°

C. and 65 mbar. First, an initial $\alpha$-$Al_2O_3$ was deposited to be a thickness of about 0.2 μm using $H_2$, HCl, $AlCl_3$, and $CO_2$, and an end $\alpha$-$Al_2O_3$ layer was deposited to be a thickness of about 8 μm using $H_2$, HCl, $AlCl_3$, $CO_2$, and $H_2S$ as source, thereby producing a first comparative sample. Table 4 shows the detailed deposition conditions of the TiCNO layer and the $\alpha$-$Al_2O_3$ layer of the first comparative sample.

TABLE 4

| | Temperature [° C.] | Pressure [mbar] | $H_2$ [vol %] | $N_2$ [vol %] | $TiCl_4$ [vol %] | $CH_3CN$ [vol %] | HCl [vol %] | $AlCl_3$ [vol %] | CO [vol %] | $CO_2$ [vol %] | $H_2S$ [vol %] |
|---|---|---|---|---|---|---|---|---|---|---|---|
| TiCNO | 1000 | 55 | 58.5 | 33.2 | 3.3 | 1.2 | — | — | 3.8 | — | — |
| Oxidation | 1000 | 55 | 70.3 | 15 | — | — | — | — | 10 | 4.7 | — |
| $Al_2O_3$ initial stage | 1000 | 65 | 91 | — | — | — | 1.7 | 3.4 | — | 3.6 | — |
| $Al_2O_3$ end stage | 1000 | 65 | 91 | — | — | — | 1.7 | 3.4 | — | 3.6 | 0.3 |

<Second Comparative Sample>

On the upper portion of the same substrate as the evaluation sample, a TiN layer and an MT-TiCN layer were deposited by a conventional method, and an HT-TiCN bonding layer having about 1 μm was deposited by the HTCVD technique. A TiN layer having about 0.5 μm was deposited on the substrate using $H_2$, $N_2$, and $TiCl_4$, and an MT-TiCN layer having about 8 μm and an HT-TiCN layer having about 1 μm were sequentially deposited on the upper surface of the TiN layer. In the case of the MT-TiCN layer, $H_2$, $TiCl_4$, and $CH_3CN$ were used as an initial-stage source at 850° C., and $H_2$, $N_2$, $TiCl_4$, and $CH_3CN$ were used as a middle-stage source. At the end stage of the TiCN deposition, an HT-TiCN bonding layer having about 1 μm was deposited on the upper surface of the MT-TiCN layer under conditions of 1,000° C. and 160 mbar according to the HTCVD method using $H_2$, $N_2$, $TiCl_4$, and $CH_4$ as source. Table 5 shows the detailed deposition conditions of TiN, MT-TiCN and HT-TiCN of the second comparative sample.

TABLE 5

| | Temperature [° C.] | Pressure [mbar] | $H_2$ [vol %] | $N_2$ [vol %] | $TiCl_4$ [vol %] | $CH_3CN$ [vol %] | HCl [vol %] | $CH_4$ [vol %] |
|---|---|---|---|---|---|---|---|---|
| TiN | 915 | 200 | 62.6 | 36.1 | 1.3 | — | — | — |
| TiCN initial stage | 850 | 70 | 96.4 | — | 2.95 | 0.65 | — | — |
| TiCN middle stage | 850 | 55 | 78.9 | 17.8 | 2.45 | 0.85 | — | — |
| TiCN end stage | 1000 | 160 | 76.6 | 16.7 | 1.6 | — | — | 5.1 |

The detailed deposition conditions of the TiCNO layer and the $\alpha$-$Al_2O_3$ layer of the second comparative sample are the same as those of the first comparative sample. However, the TiCNO layer of the second comparative sample was deposited to be a thickness of 1 μm to 3 μm, being thicker than the thickness of the first comparative sample. Table 6 shows the detailed deposition conditions of the TiCNO layer and the $\alpha$-$Al_2O_3$ layer of the second comparative sample.

TABLE 6

| | Temperature [° C.] | Pressure [mbar] | $H_2$ [vol %] | $N_2$ [vol %] | $TiCl_4$ [vol %] | $CH_3CN$ [vol %] | HCl [vol %] | $AlCl_3$ [vol %] | CO [vol %] | $CO_2$ [vol %] | $H_2S$ [vol %] |
|---|---|---|---|---|---|---|---|---|---|---|---|
| TiCNO | 1000 | 55 | 58.5 | 33.2 | 3.3 | 1.2 | — | — | 3.8 | — | — |
| Oxidation | 1000 | 55 | 70.3 | 15 | — | — | — | — | 10 | 4.7 | — |
| $Al_2O_3$ initial stage | 1000 | 65 | 91 | — | — | — | 1.7 | 3.4 | — | 3.6 | — |

TABLE 6-continued

| | Temperature [° C.] | Pressure [mbar] | H$_2$ [vol %] | N$_2$ [vol %] | TiCl$_4$ [vol %] | CH$_3$CN [vol %] | HCl [vol %] | AlCl$_3$ [vol %] | CO [vol %] | CO$_2$ [vol %] | H$_2$S [vol %] |
|---|---|---|---|---|---|---|---|---|---|---|---|
| Al$_2$O$_3$ end stage | 1000 | 65 | 91 | — | — | — | 1.7 | 3.4 | — | 3.6 | 0.3 |

FIG. 4 is a transmission electron microscope (TEM) analysis image of a cross-section of the evaluation sample according to the present disclosure, and it may be seen that the TiCNO bonding layer 107 is directly deposited on the MT-TiCN layer 105 and the α-Al$_2$O$_3$ layer 109 is deposited on the TiCNO bonding layer 107. There is no HT-TiCN layer between the MT-TiCN layer 105 and the α-Al$_2$O$_3$ layer 109. The upper layer 403, which is a temperature change layer, is seen in the MT-TiCN layer 105, and it may be confirmed that both the lower layer 401 and the upper layer 403 are columnar structures.

Figure 5:
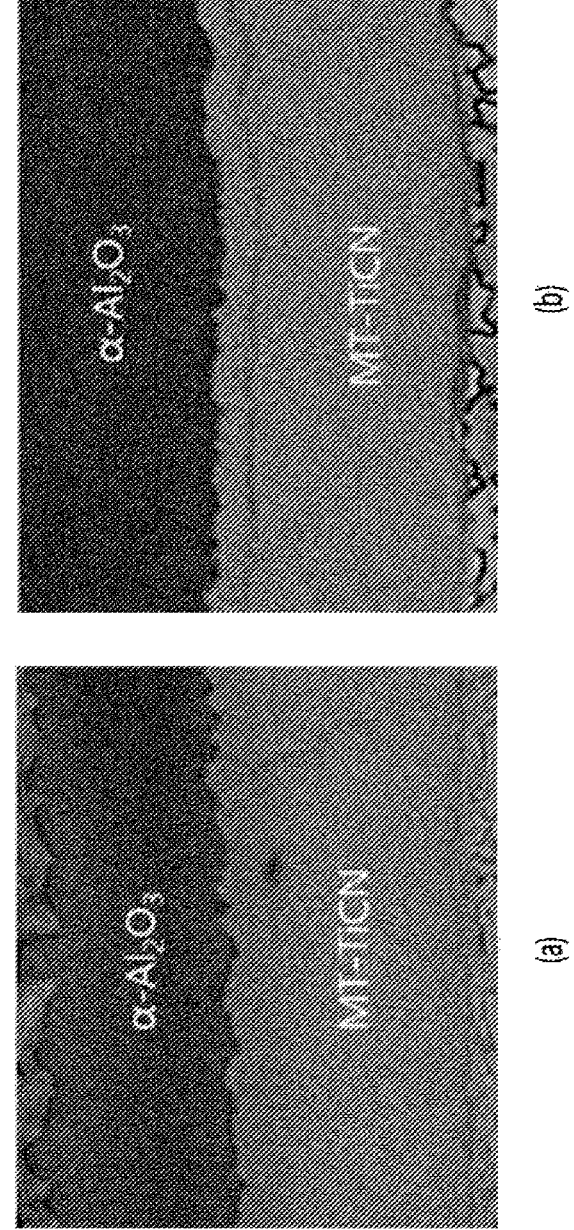
FIG. 5 is an optical microscope image, in which (a) is a cross-section image of the evaluation sample, and (b) is a cross-section image of a second comparative sample.

FIG. 5 shows images arranged for comparing a part of the evaluation sample and a part of the second comparative sample to each other, in which (a) is an image photographed with an optical microscope of the evaluation sample, and (b) is an image obtained by analyzing a cross-section of the second comparative sample with an optical microscope. The HT-TiCN layer cannot be seen in the evaluation sample of (a) in FIG. 5, and the HT-TiCN layer described in the related art is seen between the α-Al$_2$O$_3$ layer and the MT-TiCN layer in the second comparative sample of (b) in FIG. 5.

<Analysis of Texture Coefficients>

The X-ray diffraction equipment (model X'pert) made by PANalytical was utilized to analyze the texture of the coating layer, and the analysis was performed using a detector equipped with Bragg Brentano HD (hereinafter, BBHD) and PIXcel 3D. The XRD electrode material is copper (Cu), and for the analysis, a voltage of 45 kV and a wavelength of Cu-Kα of 40 mA were used. For the analysis, the BBHD equipped with a ½° anti-scatter slit and a ⅛° divergence and 10 mm-mask were used, and the detector, to which a ½ solar slit was fastened, was used. The analysis was performed on 2θ angles of 20° to 145° by the θ-2θ method. The analysis was performed on the flank plane of the sample while the appropriate height and balance of the sample were adjusted. The analysis, including background subtraction, Cu-Kα2 stripping and profile fitting of the data, was performed using PANalytical's HighScore Plus program. The texture coefficients were calculated by applying the data derived through the program to the Harris formula (Equation 1). Since the length of the path through which the X-ray penetrates is different depending on the 2θ angle of the thin film, unlike the bulk sample, the linear absorption coefficient of the thin film should be taken into account when calculating the texture coefficient, and thus the thin film correction was applied to the integrated peak area intensities for the profile fitted curve. If the α-Al$_2$O$_3$ layer is not the uppermost layer, the upper layer of the α-Al$_2$O$_3$ layer may be removed by methods such as chemical etching and blasting that do not influence the XRD measurement, and then the analysis may be performed.

According to the above-described analysis method, the texture coefficients of the α-Al$_2$O$_3$ layer and the MT-TiCN layer of the evaluation sample of the present disclosure, the first comparative sample, and the second comparative sample are shown in Table 7.

TABLE 7

| | α-Al$_2$O$_3$ TC(006) | TiCN TC(311) | TiCN TC(422) |
|---|---|---|---|
| Evaluation sample | 5.2 | 2.2 | 1.8 |
| First comparative sample | 4.2 | 2.2 | 2.0 |
| Second comparative sample | 5.4 | 2.1 | 1.8 |

Referring to Table 7, it may be seen that the MT-TiCN layer of the evaluation sample satisfies TC(311)>1.5 and TC(422)>1.5, and the α-Al$_2$O$_3$ layer also satisfies TC(006) >4. Thus, it may be seen that by using the method of the present disclosure, the α-Al$_2$O$_3$ layer with a strong (006) plane orientation may be obtained.

<Thickness Analysis>

The cross-sectional textures of the evaluation sample, the first comparative sample, and the second comparative sample were analyzed with an optical microscope at 1000× magnification to measure the thickness of each coating layer. Table 8 shows the thickness of each coating layer measured with an optical microscope at 1000× magnification. Referring to Table 8, it may be seen that the HT-TiCN layer was not formed in the evaluation sample, and the α-Al$_2$O$_3$ layer 109 was deposited to be a sufficient thickness.

TABLE 8

| Samples | TiN thickness (µm) | MT-TiCN thickness (µm) | HT-TiCN thickness (µm) | TiCNO thickness (µm) | α-Al$_2$O$_3$ thickness (µm) |
|---|---|---|---|---|---|
| Evaluation sample | 0.5 | 8.1 | — | 0.6 | 7.1 |
| First comparative sample | 0.4 | 7.5 | 1.1 | 0.5 | 6.8 |
| Second comparative sample | 0.5 | 8.0 | 0.9 | 1.5 | 7.2 |

<Performance Comparison of Evaluation Sample and Comparative Sample>

(1) Cutting Performance Evaluation: Wear Resistance Evaluation

Sample type No.: CNMG120408

Cutting conditions: Vc 300 m/min, F 0.3 mm/rev, Ap 2 mm

Workpiece: SCM440

Table 9 below is a table for comparing the lives of the tools measured when the end-of-life criterion is Vb>0.25 mm at the main cutting edge, and it may be seen that the tool life of the evaluation sample measured on the basis of the resistance against the flank wear is longer than those of the first and second comparative samples, and thus the mechanical stiffness is more excellent than those of the first and second comparative samples. Here, Vb is the flank wear.

TABLE 9

| | Average tool life (minute) |
|---|---|
| Evaluation sample | 21 |
| First comparative sample | 15 |
| Second comparative sample | 18 |

(2) Cutting Performance Evaluation: Chipping Resistance Evaluation

Sample type No.: CNMG120408

Cutting conditions: Vc 160 m/min, F 0.15-0.2 mm/rev, Ap 1.5 mm

Workpiece: S45C

Table 10 below shows the tool life measured on the basis of the occurrence of chipping without separate damage or wear, and the tool life of the evaluation sample is similar to that of the first comparative sample and longer than that of the second comparison sample. Therefore, it may be seen that the coating layer 110 produced according to the present disclosure has excellent bonding force between the MT-TiCN layer 105 and the $\alpha$-Al$_2$O$_3$ layer 109, thereby improving the chipping resistance.

TABLE 10

| | Average tool life (minute) |
|---|---|
| Evaluation sample | 10 |
| First comparative sample | 11 |
| Second comparative sample | 7 |

According to the present disclosure, a thin film for a cutting tool having improved wear-resistance and chipping resistance can be achieved by depositing an $\alpha$-Al$_2$O$_3$ layer having a strong (006) plane orientation in the <001> crystallographic direction with excellent adhesion, and a cutting tool having a predictable tool life may be provided.

The present disclosure presents a method for manufacturing a cutting tool in which a coating of $\alpha$-Al$_2$O$_3$ material is formed without using an HT-TiCN bonding layer, thereby providing a thin film having excellent mechanical properties and a cutting tool coated with the thin film in a simpler and more efficient manner as compared to conventional methods.

Although the preferred embodiments of the present invention have been illustrated and described above, the present invention is not limited to the above-described specific embodiments, and various modifications can be made by those skilled in the art without departing from the spirit and scope of the present invention defined by the appended claims, and such modifications should not be individually understood from the technical spirit or the scope of the present invention.

What is claimed is:

1. A cutting tool comprising a substrate and a coating layer formed on whole or part of the surface of the substrate, wherein the coating layer comprises an MT-TiCN layer formed by an MTCVD technique, a TiCNO bonding layer that is a bonding layer directly deposited on the surface of the MT-TiCN layer, and an $\alpha$-Al$_2$O$_3$ layer, which are sequentially formed from the substrate side, wherein an HT-TiCN layer does not exist between the MT-TiCN layer and the $\alpha$-Al$_2$O$_3$ layer, and the MT-TiCN layer has a columnar structure and has texture coefficients of TC(311)>1.5 and TC(422)>1.5, and the $\alpha$-Al$_2$O$_3$ layer has a texture coefficient of TC(006)>4 and is formed of columnar grains, wherein the TC(311), TC(422), and TC(006) are defined according to Harris formula:

$$TC(hkl) = \frac{I(hkl)}{I_0(hkl)}\left[\frac{1}{n}\sum_{n=1}^{n}\frac{I(hkl)}{I_0(hkl)}\right]^{-1}$$

wherein I(hkl) above is the reflection or diffraction intensity of the measured (hkl) plane, $I_0$(hkl) above is the standard intensity according to the powder diffraction file (PDF) of International Centre for Diffraction Data (ICDD), and the standard intensity according to the PDF Card No. 42-1489 of ICDD is used to calculate the texture coefficient of the MT-TiCN layer, and the standard intensity according to the PDF Card No. 42-1212 of ICDD is used to calculate the texture coefficient of the $\alpha$-Al$_2$O$_3$ layer, n is the number of reflecting planes used in the calculation of the texture coefficients, and the (hkI) reflecting planes used in the calculation of the texture coefficient of the MT-TiCN layer are (111), (200), (220), (311), and (422) and the (hkI) reflecting planes used in the calculation of the texture coefficient of the $\alpha$-Al$_2$O$_3$ layer are (012), (104), (110), (006), (113), and (116).

2. The cutting tool of claim 1, wherein the MT-TiCN layer comprises a lower layer and an upper layer, and a deposition temperature of the upper layer is 1.11-1.15 times higher than that of the lower layer.

3. The cutting tool of claim 2, wherein the lower layer is deposited by a chemical vapor deposition (CVD) method using H$_2$, TiCl$_4$, and CH$_3$CN as source at 850° C. at an initial stage, and using H$_2$, N$_2$, TiCl$_4$, and CH$_3$CN as source at 850° C. at a middle stage, and the upper layer is deposited by the CVD method using H$_2$, N$_2$, TiCl$_4$, CH$_3$CN, and HCl as source at 950° C.

4. The cutting tool of claim 2, wherein the thickness of the TICNO bonding layer is 0.2-1.3 μm.

5. The cutting tool of claim 3, wherein the thickness of the $\alpha$-Al$_2$O$_3$ layer is 1.5-10 μm, and the thickness of the MT-TiCN layer is 2-12 μm.

6. The cutting tool of claim 1, wherein the surface of the coating layer is subjected to a brushing process using a paste containing diamond powder.

7. The cutting tool of claim 2, wherein the coating layer further comprises a TiN layer formed on the upper surface of the $\alpha$-Al$_2$O$_3$ layer using a mixed gas of H$_2$, N$_2$, and TiCl$_4$ as source.

8. The cutting tool of claim 7, wherein the surface of the coating layer is subjected to a brushing process using a paste containing diamond powder.

9. A method for making a coating layer on the whole or part of a substrate of a cutting tool, the method comprising:

depositing a TiN layer on the upper surface of the substrate;

depositing an MT-TiCN layer which has texture coefficients of TC(311)>1.5 and TC(422)>1.5 and is formed of columnar grains of TiCN deposited on the TiN layer by a chemical vapor deposition method within the range of 800° C. to 950° C.;

depositing a TiCNO bonding layer on the upper surface of the MT-TiCN layer, and then oxidizing the TICNO bonding layer for a predetermined time using H$_2$, N$_2$, CO, and CO$_2$; and depositing, on the oxidized TiCNO bonding layer, an α-Al$_2$O$_3$ layer which has a texture coefficient of TC(006)>4 and is formed of columnar grains, wherein an HT-TiCN layer does not exist between the MT-TiCN layer and the α-Al$_2$O$_3$ layer, and wherein the TC(311), TC(422), and TC(006) are defined according to Harris formula:

$$TC(hkl) = \frac{I(hkl)}{I_0(hkl)}\left[\frac{1}{n}\sum_{n=1}^{n}\frac{I(hkl)}{I_0(hkl)}\right]^{-1},$$

wherein I(hkl) above is the reflection or diffraction intensity of the measured (hkl) plane, I$_0$(hkl) above is the standard intensity according to PDF of ICDD, and the standard intensity according to the PDF Card No. 42-1489 of ICDD is used to calculate the texture coefficient of the MT-TiCN layer, and the standard intensity according to the PDF Card No. 42-1212 of ICDD is used to calculate the texture coefficient of the α-Al$_2$O$_3$ layer, n is the number of reflecting planes used in the calculation of the texture coefficients, and the (hkI) reflecting planes used in the calculation of the texture coefficient of the MT-TiCN layer are (111), (200), (220), (311), and (422) and the (hkI) reflecting planes used in the calculation of the texture coefficient of the α-Al$_2$O$_3$ layer are (012), (104), (110), (006), (113), and (116).

10. The method of claim 9, wherein the MT-TiCN layer comprises a lower layer and an upper layer, and a deposition temperature of the upper layer is 1.11-1.15 times higher than that of the lower layer.

11. The method of claim 10, wherein the lower layer is deposited by a chemical vapor deposition (CVD) method using H$_2$, TiCl$_4$, and CH$_3$CN as source at 850° C. at an initial stage, and using H$_2$, N$_2$, TiCl$_4$, and CH$_3$CN as source at 850° C. at a middle stage, and the upper layer is deposited by the CVD method using H$_2$, N$_2$, TiCl$_4$, CH$_3$CN, and HCl as source at 950° C.

12. The method of claim 10, wherein the thickness of the TiCNO bonding layer is 0.2-1.3 μm.

13. The method of claim 12, wherein the thickness of the α-Al$_2$O$_3$ layer is 1.5-10 μm, and the thickness of the MT-TiCN layer is 2-12 μm.

14. The method of claim 10, further comprising subjecting the surface of the coating layer to a brushing process using a paste containing diamond powder.

15. The method of claim 10, further comprising making a TiN layer on the upper surface of the α-Al$_2$O$_3$ layer using a mixed gas of H$_2$, N$_2$, and TiCl$_4$ as source.

16. The method of claim 15, further comprising subjecting the surface of the coating layer to a brushing process using a paste containing diamond powder.

*   *   *   *   *